(12) United States Patent
Na et al.

(10) Patent No.: US 9,865,524 B2
(45) Date of Patent: Jan. 9, 2018

(54) SEMICONDUCTOR DEVICE AND METHOD OF FORMING CONDUCTIVE VIAS USING BACKSIDE VIA REVEAL AND SELECTIVE PASSIVATION

(71) Applicant: STATS ChipPAC, Ltd., Singapore (SG)

(72) Inventors: Duk Ju Na, Singapore (SG); Chang Beom Yong, Singapore (SG); Pandi C. Marimuthu, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/222,547

(22) Filed: Mar. 21, 2014

(65) Prior Publication Data

US 2014/0300002 A1    Oct. 9, 2014

Related U.S. Application Data

(60) Provisional application No. 61/809,770, filed on Apr. 8, 2013.

(51) Int. Cl.
*H01L 23/48* (2006.01)
*H01L 23/00* (2006.01)
(Continued)

(52) U.S. Cl.
CPC ...... *H01L 23/481* (2013.01); *H01L 21/76898* (2013.01); *H01L 23/3171* (2013.01);
(Continued)

(58) Field of Classification Search
CPC ....... H01L 23/5226; H01L 2924/01078; H01L 2924/01079; H01L 23/481; H01L 21/76898; H01L 25/0657
(Continued)

(56) References Cited

U.S. PATENT DOCUMENTS 5,618,752 A * 4/1997 Gaul .............................. 438/626
7,022,609 B2 * 4/2006 Yamamoto et al. .......... 438/694
(Continued)

OTHER PUBLICATIONS

U.S. Appl. No. 13/743,054, filed Jan. 16, 2013, by Duk Ju Na et al., Semiconductor Device and Method of Forming Through-Silicon-Via with Sacrificial Layer.

*Primary Examiner* — Bo Fan
(74) *Attorney, Agent, or Firm* — Robert D. Atkins; Patent Law Group: Atkins and Associates, P.C.

(57) ABSTRACT

A semiconductor device includes a plurality of semiconductor die and a plurality of conductive vias formed in the semiconductor die. An insulating layer is formed over the semiconductor die while leaving the conductive vias exposed. An interconnect structure is formed over the insulating layer and conductive vias. The insulating layer is formed using electrografting or oxidation. An under bump metallization is formed over the conductive vias. A portion of the semiconductor die is removed to expose the conductive vias. The interconnect structure is formed over two or more of the conductive vias. A portion of the semiconductor die is removed to leave the conductive vias with a height greater than a height of the semiconductor die. A second insulating layer is formed over the first insulating layer. A portion of the second insulating layer is removed to expose the conductive via.

25 Claims, 16 Drawing Sheets

(51) Int. Cl.
*H01L 21/768* (2006.01)
*H01L 23/31* (2006.01)
*H01L 21/66* (2006.01)

(52) U.S. Cl.
CPC .......... *H01L 23/3192* (2013.01); *H01L 24/03* (2013.01); *H01L 24/05* (2013.01); *H01L 24/11* (2013.01); *H01L 24/13* (2013.01); *H01L 24/94* (2013.01); *H01L 22/12* (2013.01); *H01L 22/14* (2013.01); *H01L 24/06* (2013.01); *H01L 24/14* (2013.01); *H01L 2224/03002* (2013.01); *H01L 2224/03009* (2013.01); *H01L 2224/0345* (2013.01); *H01L 2224/03462* (2013.01); *H01L 2224/03464* (2013.01); *H01L 2224/0401* (2013.01); *H01L 2224/05009* (2013.01); *H01L 2224/05027* (2013.01); *H01L 2224/0557* (2013.01); *H01L 2224/0558* (2013.01); *H01L 2224/05558* (2013.01); *H01L 2224/05584* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05669* (2013.01); *H01L 2224/05671* (2013.01); *H01L 2224/05684* (2013.01); *H01L 2224/06181* (2013.01); *H01L 2224/11002* (2013.01); *H01L 2224/11009* (2013.01); *H01L 2224/1132* (2013.01); *H01L 2224/1145* (2013.01); *H01L 2224/11334* (2013.01); *H01L 2224/11462* (2013.01); *H01L 2224/11464* (2013.01); *H01L 2224/11849* (2013.01); *H01L 2224/11901* (2013.01); *H01L 2224/13022* (2013.01); *H01L 2224/13025* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/14181* (2013.01); *H01L 2224/94* (2013.01); *H01L 2924/00014* (2013.01); *H01L 2924/01322* (2013.01); *H01L 2924/1033* (2013.01); *H01L 2924/10252* (2013.01); *H01L 2924/10253* (2013.01); *H01L 2924/10272* (2013.01); *H01L 2924/10322* (2013.01); *H01L 2924/10324* (2013.01); *H01L 2924/10329* (2013.01); *H01L 2924/10335* (2013.01); *H01L 2924/12041* (2013.01); *H01L 2924/12042* (2013.01); *H01L 2924/1306* (2013.01); *H01L 2924/13091* (2013.01); *H01L 2924/1433* (2013.01); *H01L 2924/1434* (2013.01); *H01L 2924/14335* (2013.01); *H01L 2924/181* (2013.01)

(58) Field of Classification Search
USPC ......... 257/E21.585, E21.577, 621, 773–776, 257/698, 686, 532; 438/613, 667, 668, 438/672, 675, 629, 637, 639, 640, 700, 438/701, 713, 978
See application file for complete search history.

(56) References Cited

U.S. PATENT DOCUMENTS

| | | | |
|---|---|---|---|
| 7,067,353 B2 * | 6/2006 | Koizumi et al. | 438/110 |
| 7,176,556 B2 * | 2/2007 | Okamoto et al. | 257/621 |
| 7,745,939 B2 * | 6/2010 | Sunohara et al. | 257/774 |
| 7,833,895 B2 | 11/2010 | Bonifield et al. | |
| 7,994,048 B2 * | 8/2011 | Komuro | 438/629 |
| 8,198,726 B2 * | 6/2012 | Nakayama et al. | 257/734 |
| 2008/0054444 A1 * | 3/2008 | Tuttle | H01L 21/76898 257/698 |
| 2010/0032810 A1 * | 2/2010 | Ding | H01L 21/6835 257/621 |
| 2010/0127346 A1 * | 5/2010 | DeNatale | H01L 23/481 257/532 |
| 2010/0133704 A1 * | 6/2010 | Marimuthu et al. | 257/778 |
| 2010/0230759 A1 * | 9/2010 | Yang et al. | 257/369 |
| 2010/0244244 A1 * | 9/2010 | Yang | 257/737 |
| 2010/0276795 A1 * | 11/2010 | Son | H01L 21/76898 257/686 |
| 2011/0068437 A1 * | 3/2011 | Chiu et al. | 257/621 |
| 2012/0104497 A1 * | 5/2012 | Denison | H01L 27/1203 257/348 |
| 2014/0199838 A1 | 7/2014 | Na et al. | |

* cited by examiner

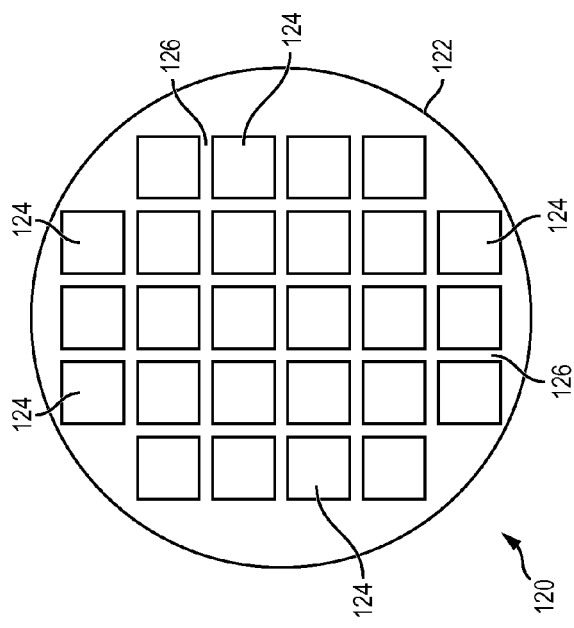
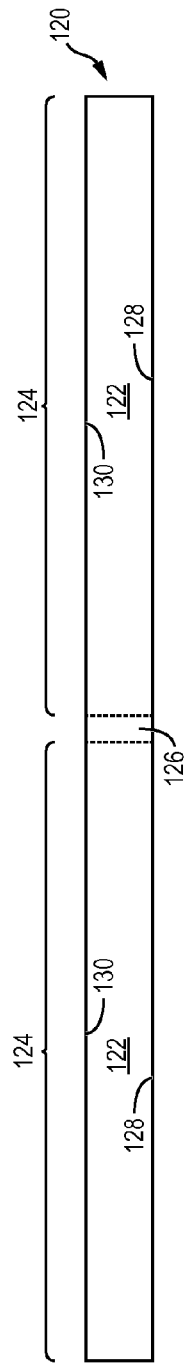

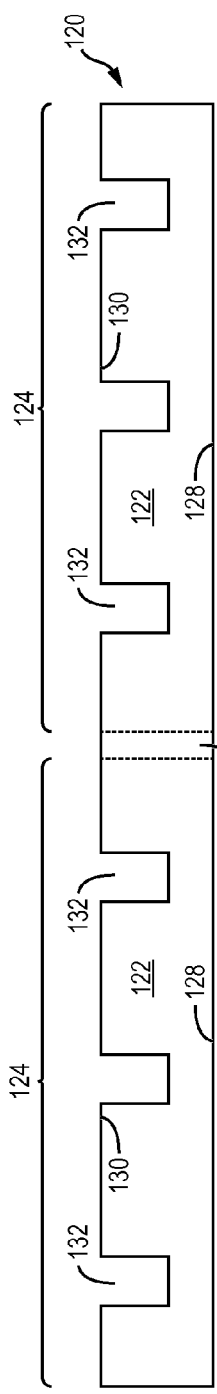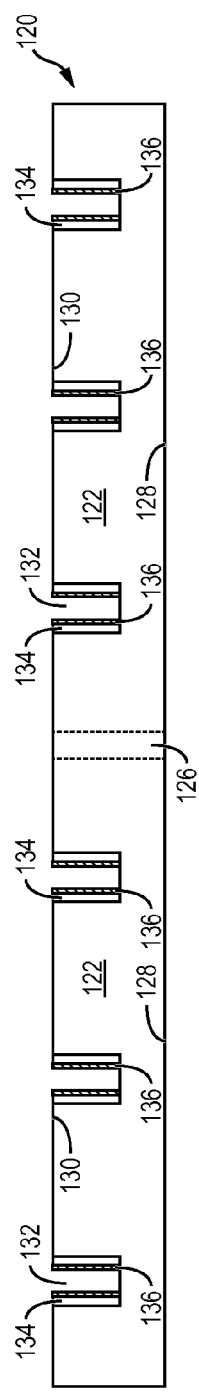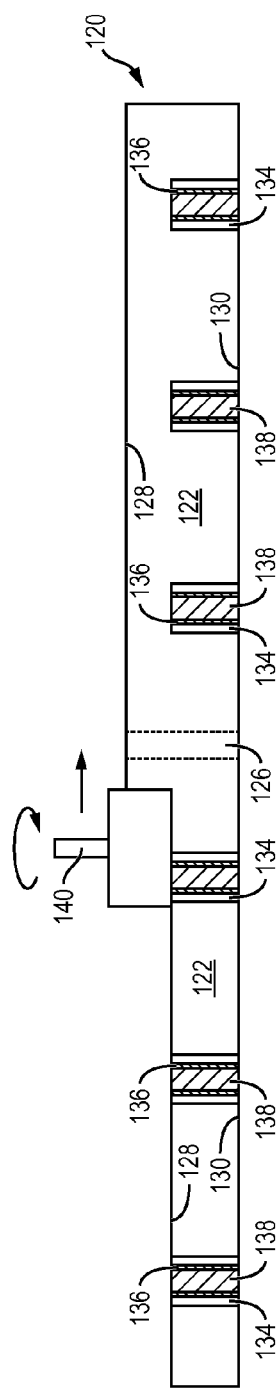

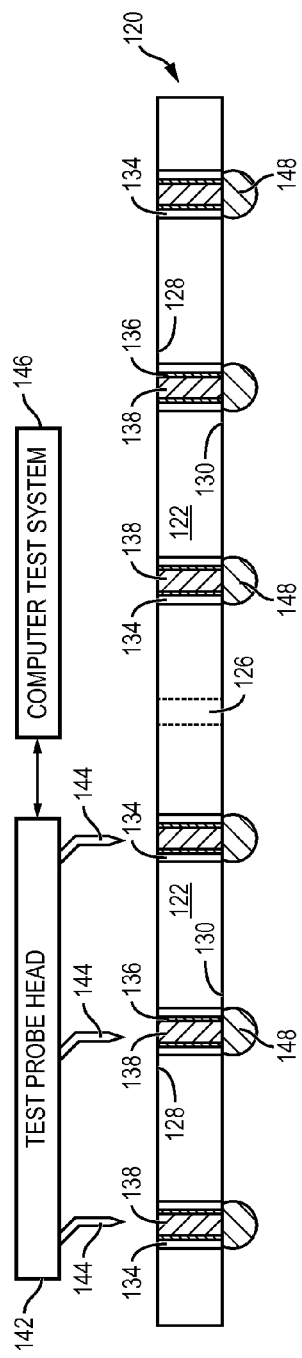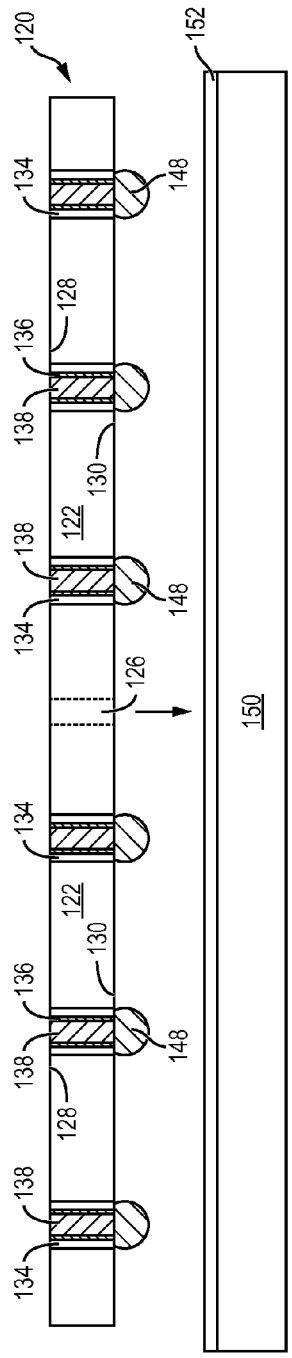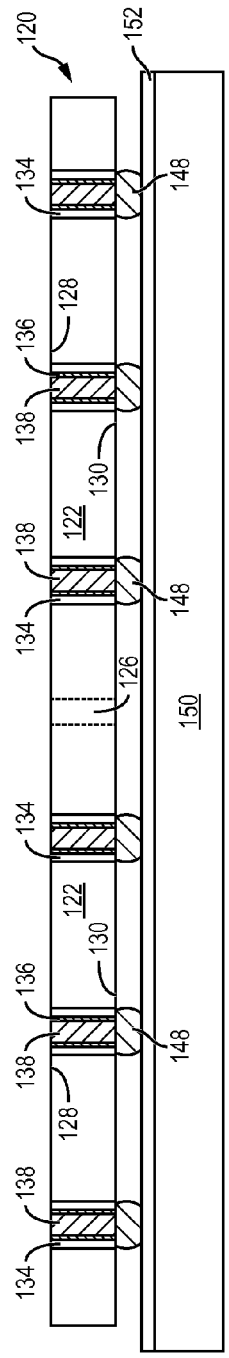

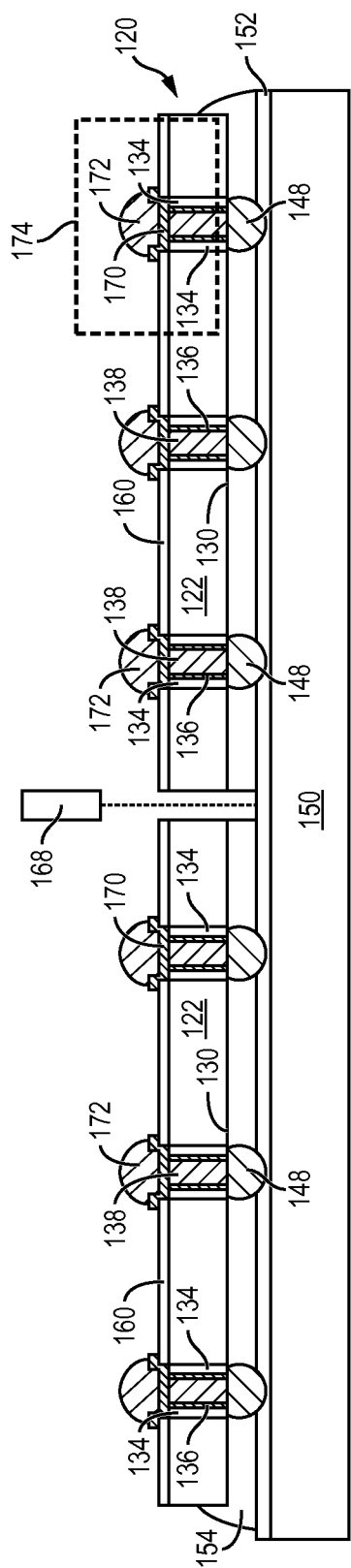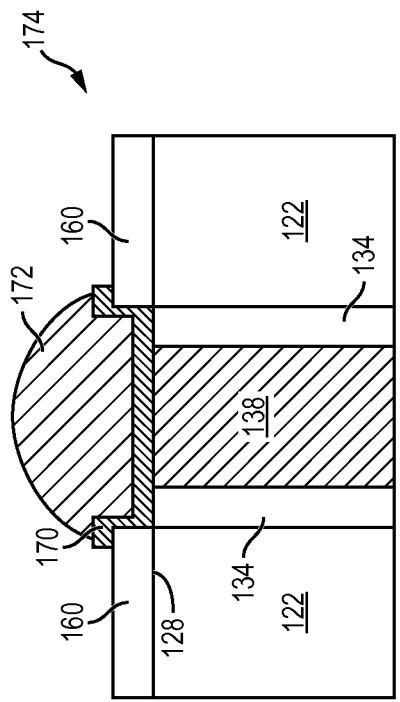
FIG. 5c
FIG. 5d

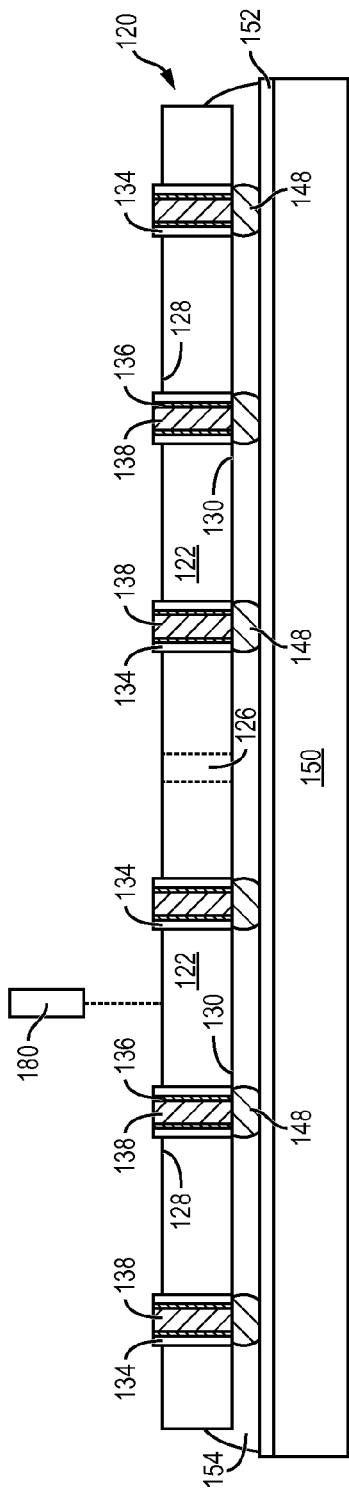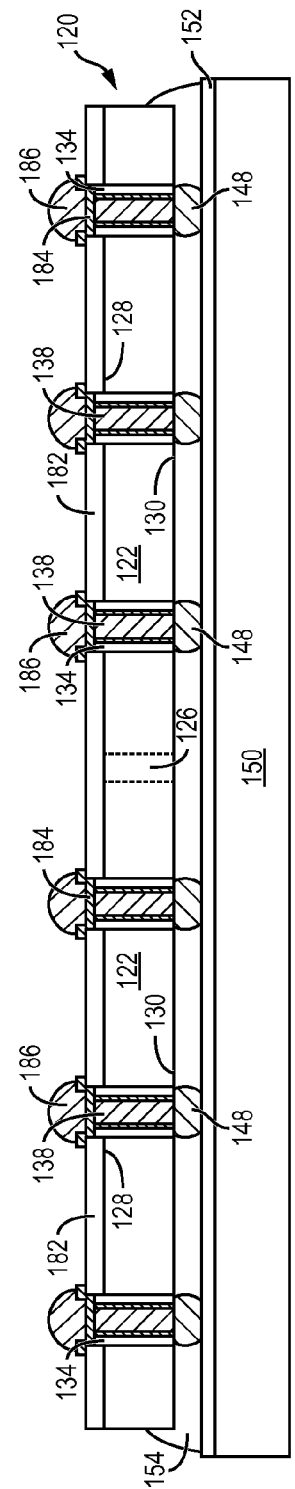

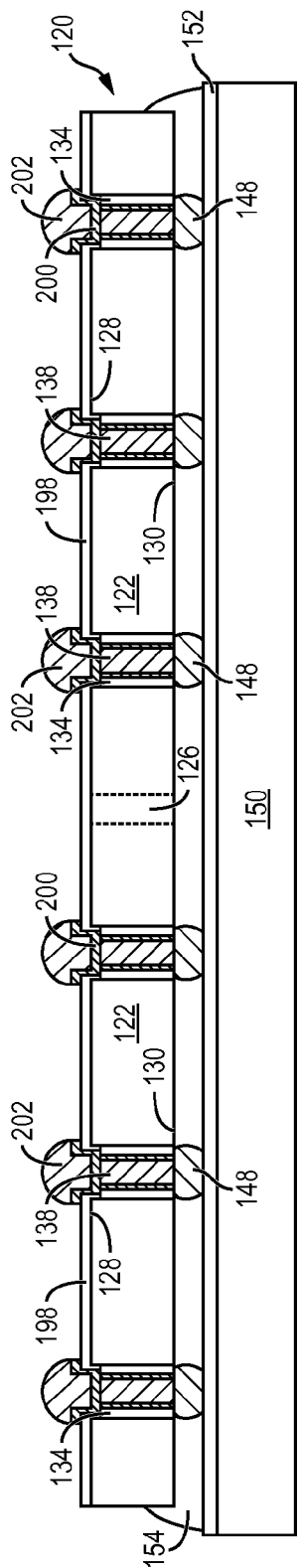
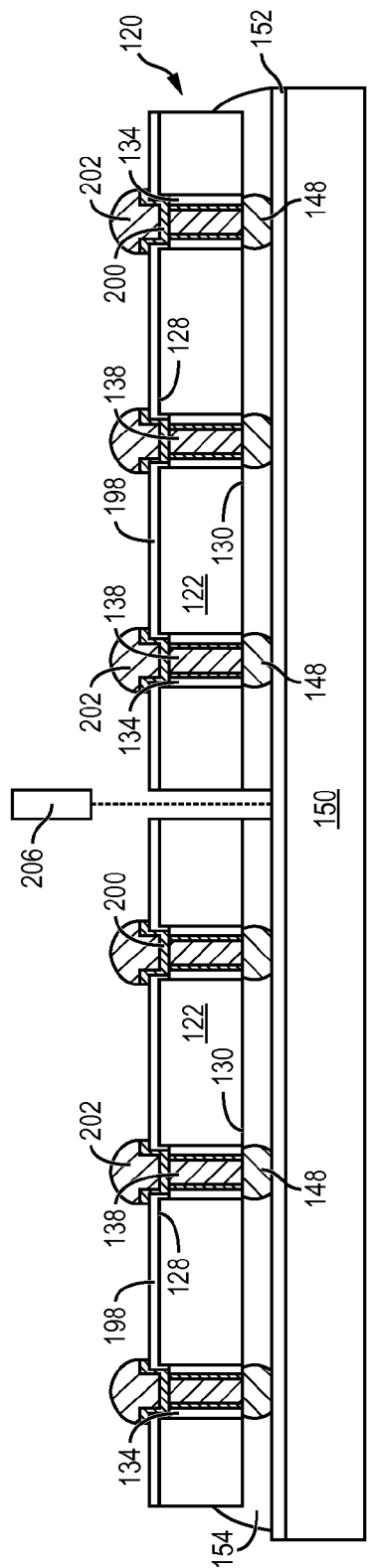

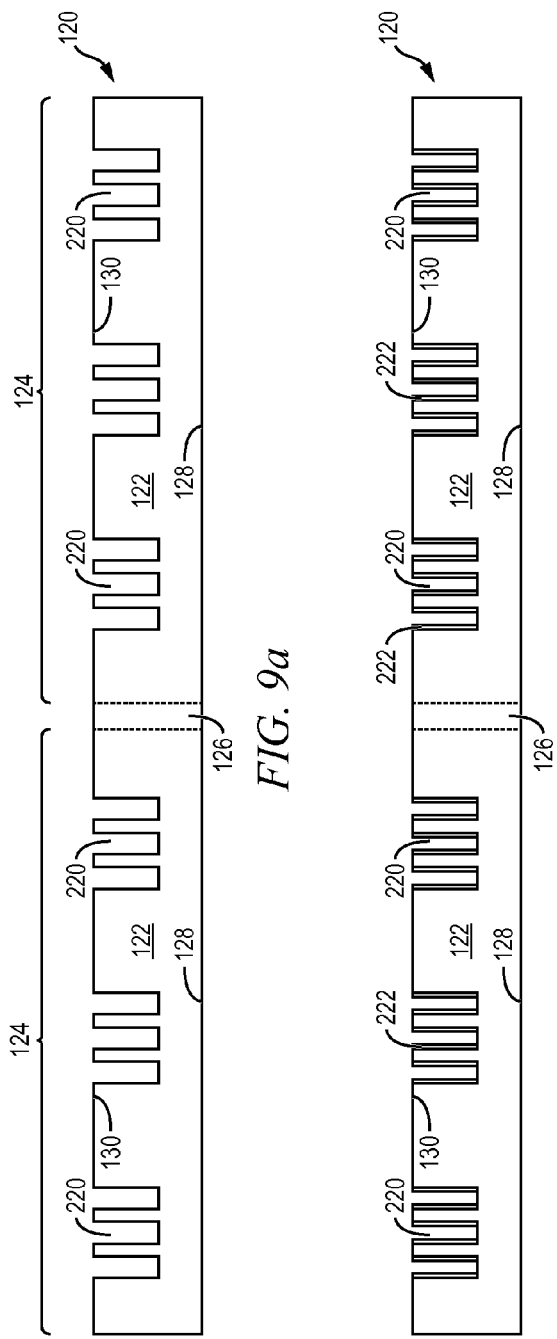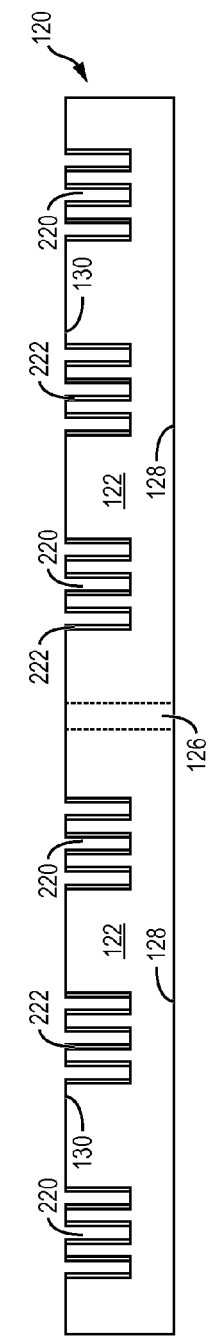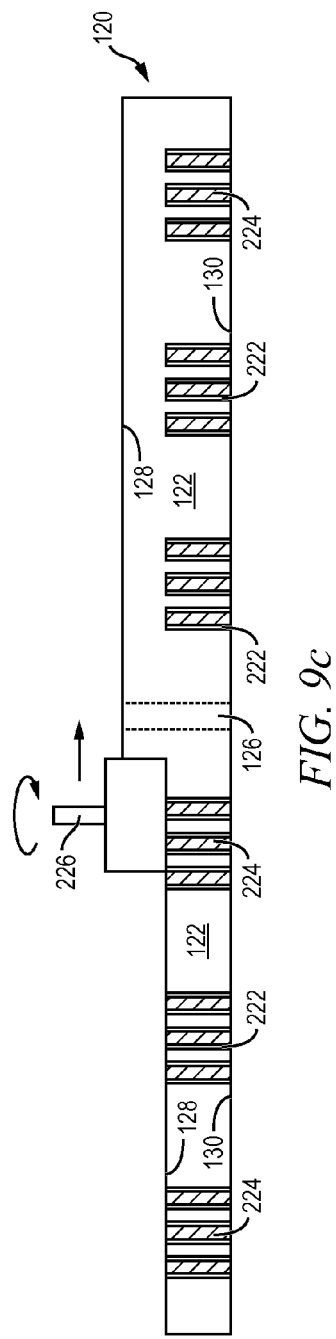

SEMICONDUCTOR DEVICE AND METHOD OF FORMING CONDUCTIVE VIAS USING BACKSIDE VIA REVEAL AND SELECTIVE PASSIVATION

CLAIM TO DOMESTIC PRIORITY

The present application claims the benefit of U.S. Provisional Application No. 61/809,770, filed Apr. 8, 2013, which application is incorporated herein by reference.

FIELD OF THE INVENTION

The present invention relates in general to semiconductor devices and, more particularly, to a semiconductor device and method of forming conductive vias using backside via reveal and selective passivation.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

The demand for high performance, small size, high density of electronic devices has driven the development of 3D integration, in which different functional devices are integrated into one package. Through silicon via (TSV) technology offers high connectivity and minimal parasitic characteristics between chips when used in 3D integration. One step used in TSV formation involves revealing the TSV after covering the TSV with an insulating layer by using chemical mechanical peeling (CMP), for example, to remove insulating material. However, CMP is a high cost process due to a high cost of consumables. Other reveal techniques such as photolithography and etching are similarly high cost processes. Additional steps increase processing costs and time as well as limit the pitch of conductive vias. Revealing the TSV proves challenging using traditional techniques as via sizes shrink below 10 micrometers ($\mu m$) due to size limitations.

Current TSV processes cover the entire surface of the TSV wafer with insulating material, including the TSVs, and require an additional TSV exposure step. The exposure steps have limited resolution and precision. For example, if the insulating layer overlay performance is 2 $\mu m$ and TSV size is 10 $\mu m$, the TSV critical dimension should be lower than 6 $\mu m$. Such small sizes are a challenge for current via reveal techniques such as CMP, photolithography, and etching. Also, reveal steps can cause resistance issue to micro bumps formed on top of TSVs as the critical dimension of the TSVs shrinks. After the required exposure steps, an insulating layer applied over the conductive TSVs limits the contact area and adhesion for forming electrical interconnect to the upper surface of the TSV. A weak adhesion between the bumps and conductive TSV reduces joint reliability.

SUMMARY OF THE INVENTION

A need exists to improve the pitch of conductive vias through semiconductor material and reduce manufacturing time and cost. Accordingly, in one embodiment, the present invention is a method of making a semiconductor device comprising the steps of providing a plurality of semiconductor die, forming a plurality of conductive vias in the semiconductor die, forming an insulating layer over the semiconductor die while leaving the conductive vias exposed, and forming an interconnect structure over the insulating layer and conductive vias.

In another embodiment, the present invention is a method of making a semiconductor device comprising the steps of providing a semiconductor die, forming a conductive via in the semiconductor die, forming a first insulating layer over the semiconductor die while leaving the conductive via exposed, and forming an interconnect structure over the first insulating layer and conductive via.

In another embodiment, the present invention is a method of making a semiconductor device comprising the steps of providing a semiconductor die, forming a conductive via in the semiconductor die, and forming a first insulating layer over the semiconductor die while leaving the conductive via exposed.

In another embodiment, the present invention is a semiconductor device comprising a semiconductor die. A conductive via is formed in the semiconductor die. A first insulating layer is formed over the semiconductor die while leaving the conductive via exposed.

BRIEF DESCRIPTION OF THE DRAWINGS

FIGS. 2a-2b illustrate a semiconductor wafer with a plurality of semiconductor die separated by a saw street;

FIGS. 3a-3l illustrate a method of making conductive vias through a semiconductor wafer using backside via reveal and a selectively applied insulating layer;

FIGS. 5a-5d illustrate a method of making a semiconductor device including a UBM layer formed over a selectively applied insulating layer and conductive via;

FIGS. 6a-6c illustrate a method of making a semiconductor wafer including TSVs extending above the level of the semiconductor wafer with a selectively applied insulating layer;

FIGS. 7a-7c illustrate a method of making a semiconductor device including a conductive via recessed below a level of a semiconductor wafer and including a selectively applied insulating layer;

FIGS. 9a-9i illustrate a semiconductor device with a multi-via structure beneath a micro-bump interconnect structure and including selectively applied insulating layer.

DETAILED DESCRIPTION OF THE DRAWINGS

Figure 1:
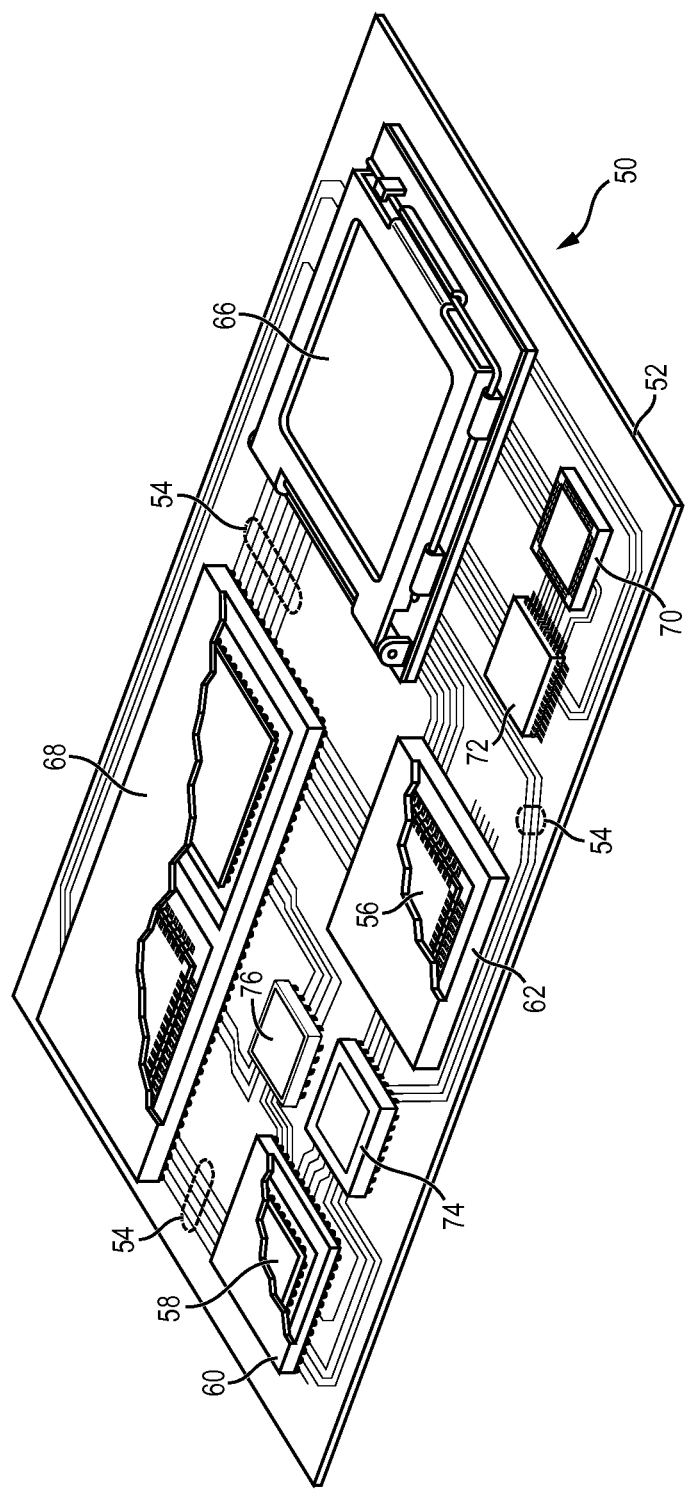
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

FIG. 2a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 200-300 millimeters (mm). In another embodiment, semiconductor wafer 120 has a width or diameter of 100-450 mm.

FIG. 2b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 are dummy die with no active surface.

Figure 3G:
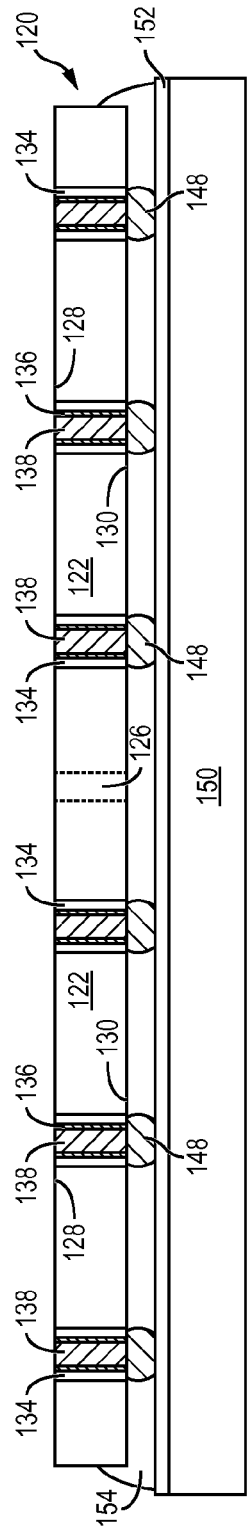

FIGS. 3a-3l continue from FIG. 2b and illustrate the process of forming TSVs through a semiconductor wafer using backside via reveal and a selectively applied insulating layer. In FIG. 3a, a plurality of vias 132 is formed into active surface 130 and through semiconductor wafer 120 using mechanical drilling, laser drilling, or deep reactive ion etching (DRIE).

In FIG. 3b, an insulating or dielectric layer 134 is formed over sidewalls of vias 132 using PVD, CVD, printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), or other suitable dielectric material.

An electrically conductive layer 136 is formed over insulating layer 134 within vias 132. Conductive layer 136 is formed using a patterning and metal deposition process such as printing, PVD, CVD, sputtering, electrolytic plating, and electroless plating. Conductive layer 136 can be one or more layers of Ni, tantalum nitride (TaN), nickel vanadium (NiV), platinum (Pt), palladium (Pd), chromium copper (CrCu), or other suitable barrier or seed material.

In FIG. 3c, vias 132 are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction conductive vias 138 lined with insulating layer 134 and conductive layer 136 and embedded within semiconductor wafer 120. In one embodiment, conductive layer 136 operates as a barrier layer to inhibit diffusion of conductive vias 138, e.g. Cu, into insulating layer 134 and base substrate material 122. Conductive vias 138 are electrically connected to the circuits on active surface 130. A portion of back surface 128 of semiconductor die 124 is removed by grinder 140 or CMP to planarize the surface and expose conductive via 138. A CMP process can also be used to planarize active surface 130 and expose conductive via 138.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

In FIG. 3d, the active and passive components within semiconductor die 124 undergo testing at the wafer level for electrical performance and circuit function. Each semiconductor die 124 is tested for functionality and electrical parameters, as shown in FIG. 3d, using a test probe head 136 including a plurality of probes or test leads 138, or other testing device. Probes 138 are used to make electrical contact with nodes or contact pads 132 on each semiconductor die 124 and provide electrical stimuli to the contact pads. Semiconductor die 124 responds to the electrical stimuli, which is measured by computer test system 140 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package An electrically conductive bump material is deposited over conductive via 138 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive via 138, which is coplanar with either the active surface 130 or the back surface 128, using a suitable attachment or bonding process. In one embodiment, the bump material is reflowed by heating the material above its melting point to form spherical balls or bumps 148. In some applications, bumps 148 are reflowed a second time to improve electrical contact to conductive via 138. An optional under bump metallization (UBM) layer can be disposed between bumps 148 and conductive via 138. Bumps 148 can also be compression bonded to conductive via 138. Bumps 148 represent one type of interconnect structure that can be formed over conductive via 138. The interconnect structure can also use stud bumps, micro bumps, or other electrical interconnect structures.

FIG. 3e shows a substrate or carrier 150 containing sacrificial base material such as silicon, polymer, beryllium oxide, glass, or other suitable low-cost, rigid material for structural support. An optional interface layer or double-sided tape 152 is formed over carrier 150 as an adhesive bonding film, etch-stop layer, or thermal release layer. Semiconductor wafer 120 is positioned over and mounted to interface layer 152 over carrier 150 with active surface 130 oriented toward the carrier. FIG. 3f shows semiconductor wafer 120 mounted to interface layer 152 over carrier 150.

Semiconductor wafer 120 and carrier 150 are placed in a chase mold. In FIG. 3g, a mold underfill (MUF) material 154 in a liquid state is injected into the chase mold between semiconductor wafer 120 and carrier 150. MUF material 154 can be an encapsulant, molding compound, or polymer composite material, such as epoxy resin with filler, epoxy acrylate with filler, or polymer with proper filler. MUF material 154 is cured. MUF material 154 is disposed between semiconductor wafer 120 and carrier 150. MUF 154 is non-conductive and environmentally protects the semiconductor device from external elements and contaminants.

Figure 3H:
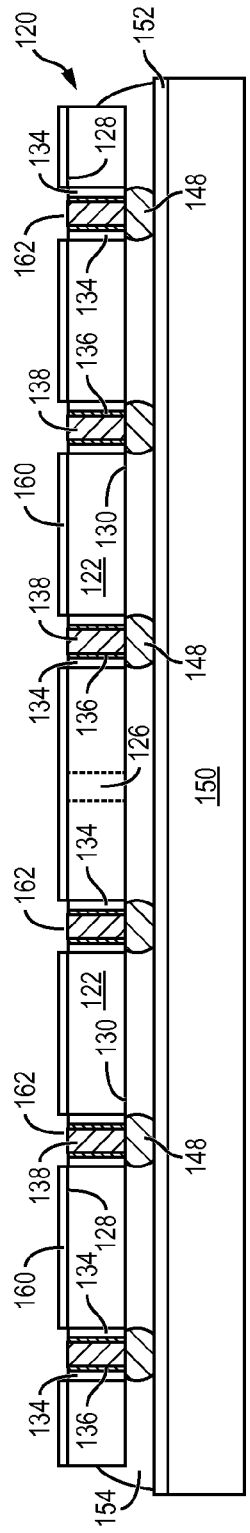

In FIG. 3h, an insulating or dielectric layer 160 is selectively formed over surface 128 of semiconductor wafer 120 using oxidation or electrografting while leaving insulating layer 134, conductive layer 136, and conductive via 138 exposed from insulating layer 160 by opening 162. By selectively forming insulating layer 160 to leave insulating layer 134, conductive layer 136, and conductive via 138 exposed, a further step such as CMP, photolithography, or etching is not required to expose vias 138. Eliminating the etching or photo step enables the conductive via 138 to have a smaller critical dimension (CD). In one embodiment, the CD of the via is less than 6 μm. Furthermore, the etch or photo methods of forming an opening in the insulating layer can cause resistance issues when bumps are later formed over conductive via 138. In one embodiment, insulating layer 160 is less than 10 μm thick. In another embodiment, insulating layer 160 is formed over surface 128 of wafer 120 using PVD, CVD, printing, spin coating, or spray coating to form insulating layer 160 while leaving insulating layer 134, conductive layer 136, and conductive via 138 exposed. Insulating layer 160 contains one or more layers of SiO2, Si3N4, SiON, Ta2O5, Al2O3, HfO2, PI, BCB, PBO, polymer, or other material having similar dielectric properties.

Figure 3I:
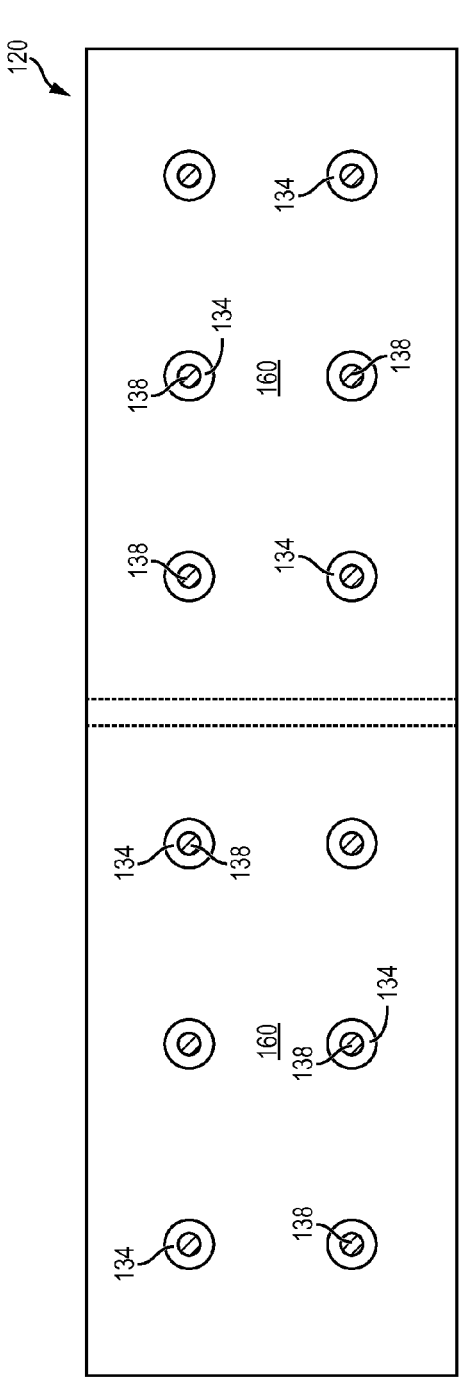

FIG. 3i shows a plan view of semiconductor die 124 over back surface 128. Back surface 128 is covered by selectively applied insulating layer 160. Insulating layer 134, conductive layer 136, and conductive via 138 are exposed from selectively applied insulating layer 160. In one embodiment, semiconductor wafer 120 is flipped and insulating layer 160 is selectively applied over active surface 130.

Figure 3J:
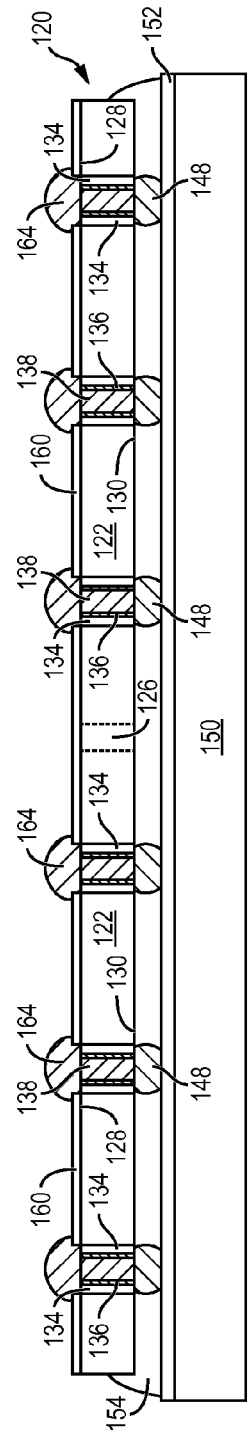

In FIG. 3j, an electrically conductive bump material is deposited into opening 162 and over exposed conductive via 138 and insulating layer 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive via 138 using a suitable attachment or bonding process. In one embodiment, the bump material is reflowed by heating the material above the melting point to form balls or bumps 164. In some applications, bumps 164 are reflowed a second time to improve electrical contact to conductive via 138. Bumps 164 can also be compression bonded to conductive via 138. Bumps 164 represent one type of interconnect structure that can be formed over conductive via 138. The interconnect structure can also use bond wires, conductive paste, stud bump, micro bump, or other electrical interconnect.

Figure 3K:
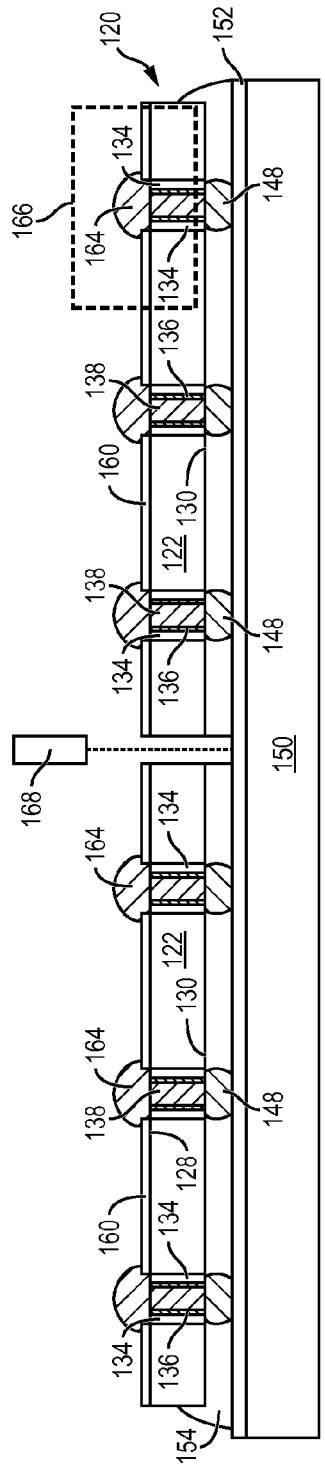

In FIG. 3k, semiconductor wafer 120 is singulated through insulating layer 160, saw street 126, and MUF material 154 using a saw blade or laser cutting tool 168 into individual semiconductor die 124. Carrier 150 and interface layer 152 are removed by chemical etching, mechanical peeling, CMP, mechanical grinding, thermal bake, UV light, laser scanning, or wet stripping to expose bumps 148. In one embodiment, MUF material 154 between semiconductor wafer 120 and carrier 150 are removed. The individual semiconductor die 124 can be inspected and electrically tested for identification of KGD post singulation.

Figure 3L:
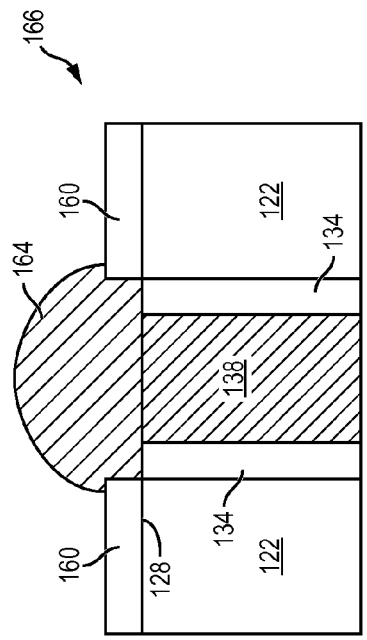

FIG. 3l shows further detail of insulating layer 134, conductive layer 136, conductive via 138, and insulating layer 160 in block 166 defined in FIG. 3k. In particular, insulating layer 134 extends to surface 128 of semiconductor wafer 120. Exposed conductive via 138 operates as a UBM structure formed on a back surface of semiconductor wafer 120. Optional barrier or seeding layer 136 is omitted in FIG. 3l. In one embodiment, bumps 164 are formed by electroless plating to an upper surface of conductive via 138 exposed and extending from insulating layer 160.

Figure 4:
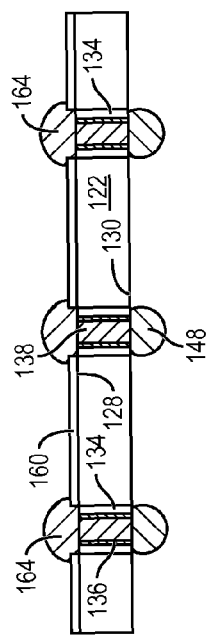
FIG. 4 illustrates a semiconductor device after singulation and including a selectively applied insulating layer.

FIG. 4 shows semiconductor die 124 after singulation. The circuits on active surface 130 of semiconductor die 124 are electrically connected to conductive via 138, bumps 148 and bumps 164. Insulating layer 160 is selectively applied on semiconductor die 124 leaving conductive via 138 exposed by opening 162 without requiring an additional photo, etch, or ablation step. By selectively forming insulating layer 160 to leave insulating layer 134, conductive layer 136, and conductive via 138 exposed, a further step such as CMP, photolithography, or etching is not required to expose vias 138. Eliminating the etching or photo step enables the conductive via 138 to have a smaller CD. In one embodiment, the CD of the via is less than 6 µm. Insulating layer 160 covers surface 128 of semiconductor wafer 120 while leaving insulating layer 134, conductive layer 136, and conductive via 138 exposed. Bumps 164 are formed over the exposed conductive via 138.

Figure 5A:
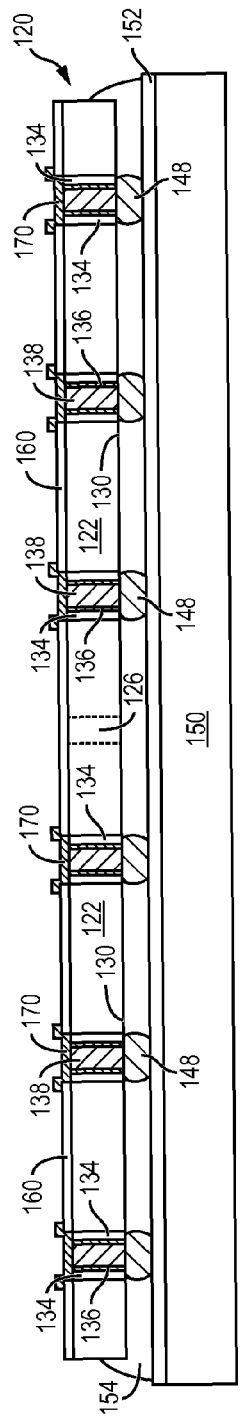

FIGS. 5a-5d continue from FIG. 3i and illustrate a semiconductor device similar to that of FIGS. 3a-3l including a UBM layer formed over selectively applied insulating layer 160 and conductive via 138. In FIG. 5a, an electrically conductive layer 170 is formed over insulating layer 134, conductive layer 136, conductive via 138, and selectively applied insulating layer 160 using a patterning and metal deposition process such as sputtering, electrolytic plating, and electroless plating. Conductive layer 170 can be one or more layers of Al, Cu, Sn, Ni, Au, Ag, or other suitable electrically conductive material. Conductive layer 170 operates as an under bump metallization (UBM) layer electrically connected to conductive via 138. In one embodiment, UBM layer 170 includes an adhesion layer, seed layer, and wetting and barrier layer. The adhesion layer can be titanium (Ti), titanium nitride (TiN), titanium tungsten (TiW), Al, or chromium (Cr). The seed layer is formed over the adhesion layer and can be Cu, Ni, NiV, Au, or Al. The wetting and barrier layer is formed over the seed layer and can be Ni, NiV, platinum (Pt), palladium (Pd), TiW, or chromium copper (CrCu). The barrier layer inhibits the diffusion of Cu into the die. UBM layer 170 aids with adhesion to conductive via 138.

Figure 5B:
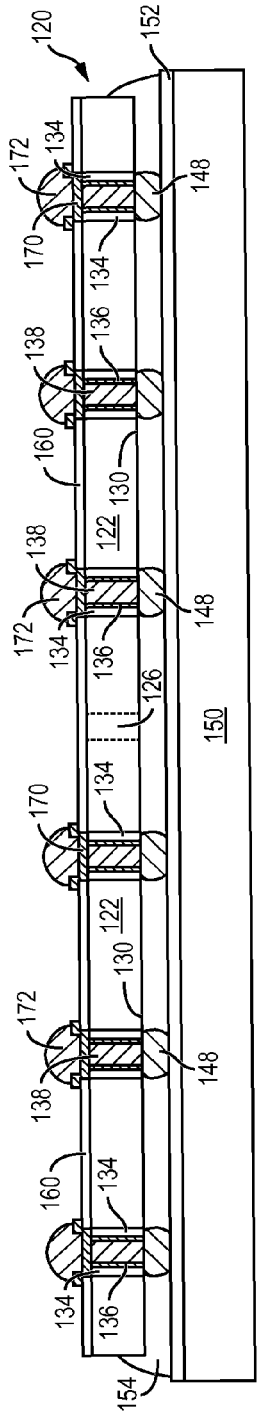

In FIG. 5b, an electrically conductive bump material is deposited into opening 162 and over exposed conductive via 138 and insulating layer 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive via 138 using a suitable attachment or bonding process. In one embodiment, the bump material is reflowed by heating the material above its melting point to form balls or bumps 172. In some applications, bumps 172 are reflowed a second time to improve electrical contact to conductive via 138. Bumps 172 can also be compression bonded to conductive via 138. Bumps 172 represent one type of interconnect structure that can be formed over conductive via 138. The interconnect structure can also use stud bumps, micro bumps, or other electrical interconnect structures.

In FIG. 5c, semiconductor wafer 120 is singulated through insulating layer 160, saw street 126, and MUF material 154 using a saw blade or laser cutting tool 168 to separate individual semiconductor die 124. Carrier 150 and interface layer 152 are removed by chemical etching, mechanical peeling, CMP, mechanical grinding, thermal bake, UV light, laser scanning, or wet stripping to expose bumps 148. In one embodiment, MUF material 154 disposed between semiconductor wafer 120 and carrier 150 is also removed.

FIG. 5d shows further detail of insulating layer 134, conductive layer 136, conductive via 138, and selectively applied insulating layer 160 in block 174 defined in FIG. 5c. In particular, insulating layer 134 extends to surface 128 of semiconductor wafer 120. UBM layer 170 is formed over conductive via 138, and insulating layer 134 and over back surface 128 of semiconductor wafer 120. Optional conductive layer 136 is omitted in FIG. 5d. In one embodiment, bumps 172 are formed by electroless plating to an upper surface of UBM 170 extending from opening 162 of insulating layer 160. Insulating layer 160 is selectively applied leaving conductive via 138 exposed by opening 162 without requiring an additional photo, etch, or ablation step. Insulating layer 160 covers surface 128 of semiconductor wafer 120 while leaving insulating layer 134 and conductive via 138 exposed. Bumps 164 are formed over UBM 170.

Figure 6C:
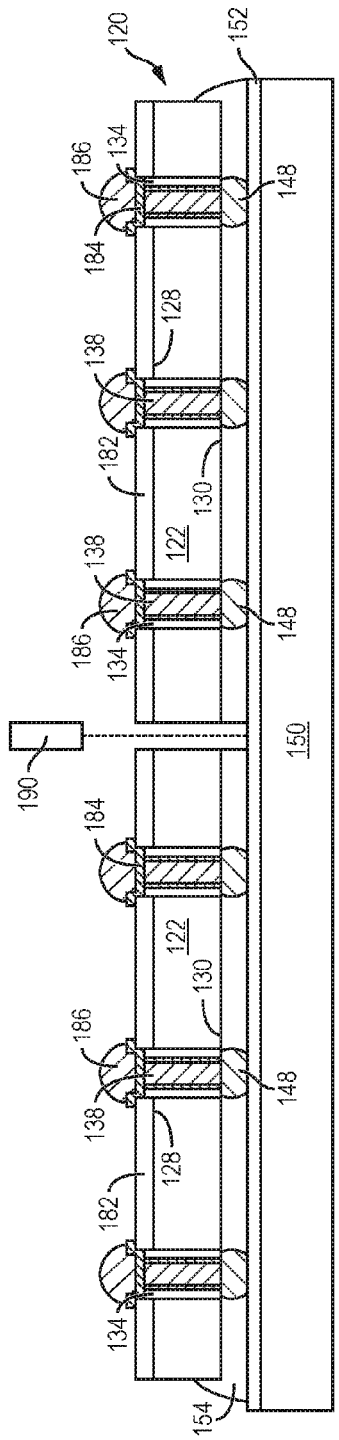

FIGS. 6a-6c illustrate a process of forming a semiconductor wafer including TSVs extending above the level of the semiconductor wafer continuing from FIG. 3i. In FIG. 6a, a portion of back surface 128 of semiconductor wafer 120 is removed by an etching or CMP process. Alternatively, a portion of back surface 128 of semiconductor wafer 120 is removed by LDA using laser 180. The amount of base substrate material 122 removed determines the height that conductive via 138 extends above surface 128 of semiconductor wafer 120. Accordingly, insulating layer 134, conductive layer 136, and conductive via 138 are coplanar with one another and extend above surface 128 of semiconductor wafer 120.

In FIG. 6b, an insulating or dielectric layer 182 is selectively formed over surface 128 of semiconductor wafer 120 using oxidation or electrografting while leaving insulating layer 134, conductive layer 136, and conductive via 138 exposed by an opening in insulating layer 182. By selectively forming insulating layer 182 to leave insulating layer 134, conductive layer 136, and conductive via 138 exposed, a further step such as CMP, photolithography, or etching is not required to expose vias 138. Eliminating the etching or photo step enables the conductive via 138 to have a smaller CD. In one embodiment, the CD of the via is less than 6 µm. In one embodiment, insulating layer 182 is formed over surface 128 of wafer 120 using PVD, CVD, printing, spin coating, or spray coating to form insulating layer 182 while leaving insulating layer 134, conductive layer 136, and conductive via 138 exposed. Insulating layer 182 contains one or more layers of SiO2, Si3N4, SiON, Ta2O5, Al2O3, HfO2, PI, BCB, PBO, polymer, or other material having similar dielectric properties.

In FIG. 6c, an electrically conductive layer 184 is formed over insulating layer 134, conductive layer 136, conductive via 138, and selectively applied insulating layer 182 using a patterning and metal deposition process such as sputtering, electrolytic plating, and electroless plating. Conductive layer 184 can be one or more layers of Al, Cu, Sn, Ni, Au, Ag, or other suitable electrically conductive material. Conductive layer 184 operates as an under bump metallization (UBM) layer electrically connected to conductive via 138. In one embodiment, UBM layer 184 includes an adhesion layer, seed layer, and wetting and barrier layer. The adhesion layer can be titanium (Ti), titanium nitride (TiN), titanium tungsten (TiW), Al, or chromium (Cr). The seed layer is formed over the adhesion layer and can be Cu, Ni, NiV, Au, or Al. The wetting and barrier layer is formed over the seed layer and can be Ni, NiV, platinum (Pt), palladium (Pd), TiW, or chromium copper (CrCu). The barrier layer inhibits the diffusion of Cu into the die. UBM layer 184 aids with adhesion to conductive via 138.

An electrically conductive bump material is deposited into the opening and over exposed conductive via 138 and insulating layer 182 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive via 138 using a suitable attachment or bonding process. In one embodiment, the bump material is reflowed by heating the material above its melting point to form balls or bumps 186. In some applications, bumps 186 are reflowed a second time to improve electrical contact to conductive via 138. Bumps 186 can also be compression bonded to conductive via 138. Bumps 186 represent one type of interconnect structure that can be formed over conductive via 138. The interconnect structure can also use stud bumps, micro bumps, or other electrical interconnect structures.

Semiconductor wafer 120 is singulated through insulating layer 182, saw street 126, and MUF material 154 using a saw blade or laser cutting tool 190 to separate individual semiconductor die 124. Carrier 150 and interface layer 152 are removed by chemical etching, mechanical peeling, CMP, mechanical grinding, thermal bake, UV light, laser scanning, or wet stripping to expose bumps 148. In one embodiment, MUF material 154 disposed between semiconductor wafer 120 and carrier 150 is also removed.

Figure 7A:
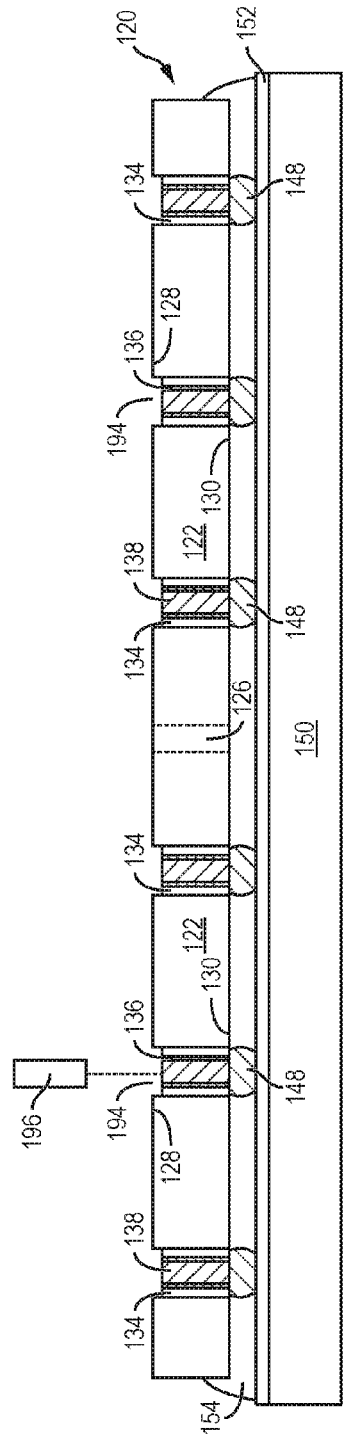

FIGS. 7a-7c continue from FIG. 3g and illustrate a semiconductor device similar to that of FIGS. 3a-3l with conductive via 138, conductive layer 136, and insulating layer 134 recessed below a surface of semiconductor wafer 120. In FIG. 7a, a portion of insulating layer 134 and conductive layer 136 around conductive via 138 is removed by an etching process through a patterned photoresist layer to form recesses 194 into base substrate material 122. Alternatively, recesses 194 are formed by LDA using laser 196. In one embodiment, the depth of recesses 194 is 1-20 μm.

In FIG. 7b, an insulating or dielectric layer 198 is selectively formed over surface 128 of semiconductor wafer 120 using oxidation or electrografting while leaving insulating layer 134, conductive layer 136, and conductive via 138 exposed an opening in insulating layer 198 over recess 194. By selectively forming insulating layer 198 to leave insulating layer 134, conductive layer 136, and conductive via 138 exposed, a further step such as CMP, photolithography, or etching is not required to expose vias 138. Eliminating the etching or photo step enables the conductive via 138 to have a smaller CD. In one embodiment, the via CD is less than 6 μm. In one embodiment, insulating layer 198 is formed over surface 128 of wafer 120 using PVD, CVD, printing, spin coating, or spray coating to form insulating layer 198 while leaving insulating layer 134, conductive layer 136, and conductive via 138 exposed. Insulating layer 198 contains one or more layers of SiO2, Si3N4, SiON, Ta2O5, Al2O3, HfO2, PI, BCB, PBO, polymer, or other material having similar dielectric properties.

An electrically conductive layer 200 is formed over insulating layer 134, conductive layer 136, conductive via 138, and selectively applied insulating layer 198 using a patterning and metal deposition process such as sputtering, electrolytic plating, and electroless plating. Conductive layer 200 can be one or more layers of Al, Cu, Sn, Ni, Au, Ag, or other suitable electrically conductive material. Conductive layer 200 operates as an under bump metallization (UBM) layer electrically connected to conductive via 138. In one embodiment, UBM layer 200 includes an adhesion layer, seed layer, and wetting and barrier layer. The adhesion layer can be titanium (Ti), titanium nitride (TiN), titanium tungsten (TiW), Al, or chromium (Cr). The seed layer is formed over the adhesion layer and can be Cu, Ni, NiV, Au, or Al. The wetting and barrier layer is formed over the seed layer and can be Ni, NiV, platinum (Pt), palladium (Pd), TiW, or chromium copper (CrCu). The barrier layer inhibits the diffusion of Cu into the die. UBM layer 200 aids with adhesion to conductive via 138.

An electrically conductive bump material is deposited into recess 194 and over exposed conductive via 138 and insulating layer 198 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive via 138 using a suitable attachment or bonding process. In one embodiment, the bump material is reflowed by heating the material above its melting point to form balls or bumps 202. In some applications, bumps 202 are reflowed a second time to improve electrical contact to conductive via 138. Bumps 202 can also be compression bonded to conductive via 138. Bumps 202 represent one type of interconnect structure that can be formed over conductive via 138. The interconnect structure can also use stud bumps, micro bumps, or other electrical interconnect structures.

In FIG. 7c, semiconductor wafer 120 is singulated through insulating layer 198, saw street 126, and MUF material 154 using a saw blade or laser cutting tool 206 into individual semiconductor die 124. Carrier 150 and interface layer 152 are removed by chemical etching, mechanical peeling, CMP, mechanical grinding, thermal bake, UV light, laser scanning, or wet stripping to expose bumps 148. In one embodiment, MUF material 154 disposed between semiconductor wafer 120 and carrier 150 is also removed.

Figure 8A:
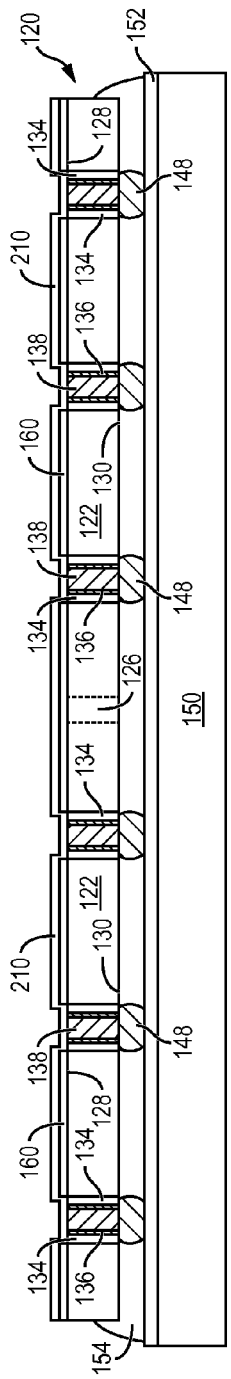
FIGS. 8a-8c illustrate a method of making a semiconductor device with a second insulating layer formed over a selectively applied insulating layer.
Figure 8B:
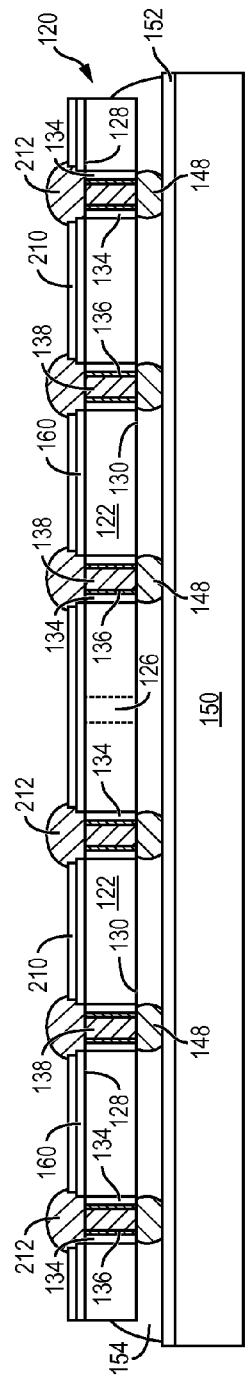
Figure 8C:
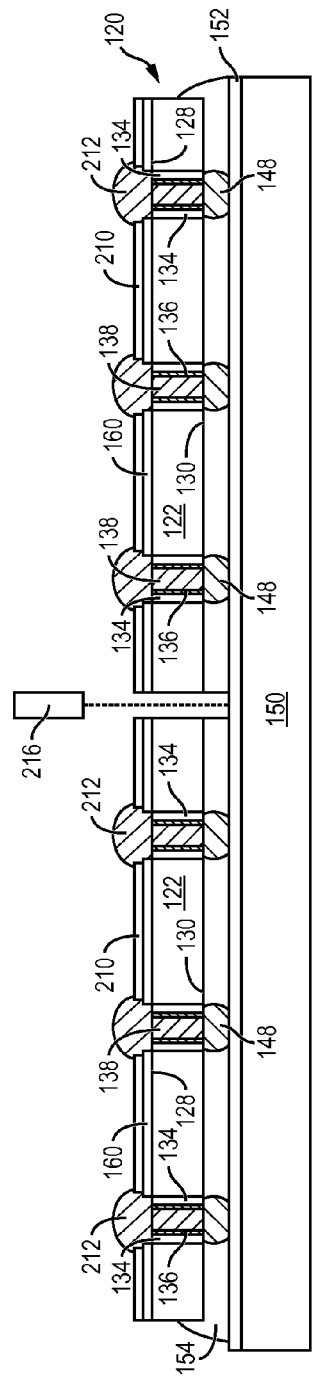

FIGS. 8a-8c continue from FIG. 3i and illustrate a semiconductor device similar to that of FIGS. 3a-3l with a second insulating layer formed over insulating layer 160. In FIG. 8a, an insulating or dielectric layer 210 is formed over selectively applied insulating layer 160 and into opening 162 using PVD, CVD, printing, spin coating, spray coating, sintering or thermal oxidation to completely cover insulating layer 134, conductive layer 136, and conductive via 138. The insulating layer 210 contains one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), or other suitable dielectric material.

In FIG. 8b, a portion of insulating layer 210 is removed by an etching process through a photo mask to expose insulating layer 134, conductive layer 136, and conductive via 138. Alternatively, laser direct ablation (LDA) is used to expose insulating layer 134, conductive layer 136, and conductive via 138 without requiring the use of a photo mask.

An electrically conductive bump material is deposited into opening 162 and over exposed conductive via 138 and insulating layers 160 and 210 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive via 138 using a suitable attachment or bonding process. In one embodiment, the bump material is reflowed by heating the material above its melting point to form balls or bumps 212. In some applications, bumps 212 are reflowed a second time to improve electrical contact to conductive via 138. Bumps 212 can also be compression bonded to conductive via 138. Bumps 212 represent one type of interconnect structure that can be formed over conductive via 138. The interconnect structure can also use stud bumps, micro bumps, or other electrical interconnect structures.

In FIG. 8c, semiconductor wafer 120 is singulated through insulating layers 160 and 210, saw street 126, and MUF material 154 using a saw blade or laser cutting tool 216 into individual semiconductor die 124. Carrier 150 and interface layer 152 are removed by chemical etching, mechanical peeling, CMP, mechanical grinding, thermal bake, UV light, laser scanning, or wet stripping to expose bumps 148. In one embodiment, MUF material 154 disposed between semiconductor wafer 120 and carrier 150 is also removed.

Figure 9D:
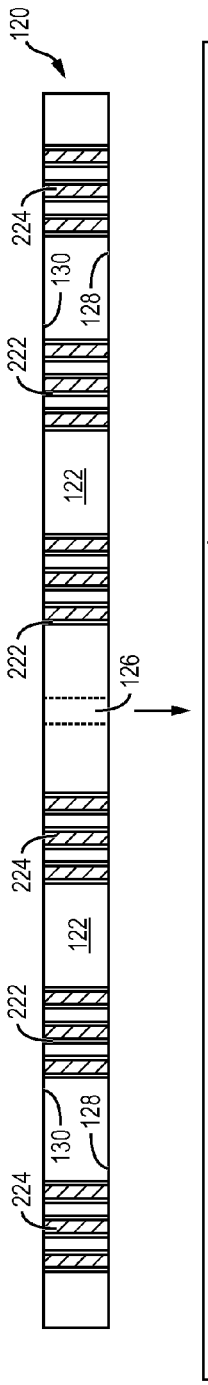

FIGS. 9a-9i continue from FIG. 2b and illustrate a semiconductor device similar to that of FIGS. 3a-3l with a multi via structure beneath a micro-bump interconnect structure. In FIG. 9a, a plurality of micro vias 220 is formed into active surface 130 and through semiconductor wafer 120 using mechanical drilling, laser drilling, or deep reactive ion etching (DRIE).

In FIG. 9b, an insulating or dielectric layer 222 is formed over sidewalls of micro vias 220 using PVD, CVD, printing, spin coating, spray coating, sintering or thermal oxidation. The insulating layer 222 contains one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), or other suitable dielectric material.

In FIG. 9c, micro vias 220 are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction conductive micro vias 224 lined with insulating layer 222 and embedded within semiconductor wafer 120. In one embodiment, an optional conductive layer formed between insulating layer 222 and conductive micro via 224 operates as a barrier layer to inhibit diffusion of conductive micro via 224, e.g. Cu, into insulating layer 222 and base substrate material 122. Conductive micro vias 224 are electrically connected to the circuits on active surface 130. A portion of back surface 128 of semiconductor die 124 is removed by grinder 140 or CMP to planarize the surface and expose conductive micro via 224. A CMP process can also be used to planarize active surface 130 and expose conductive micro via 224.

Figure 9E:
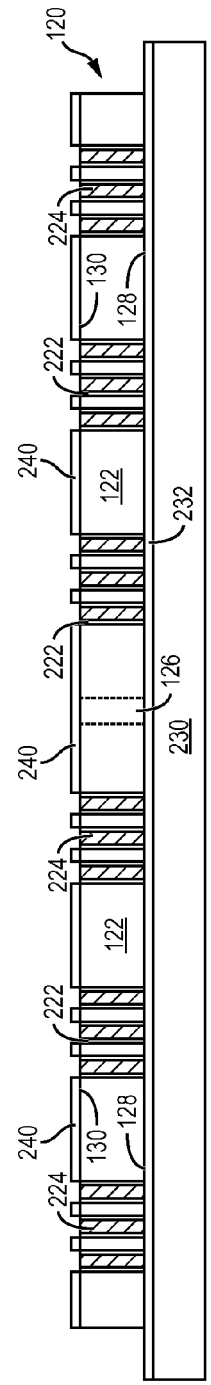

FIG. 9d shows a substrate or carrier 230 containing sacrificial base material such as silicon, polymer, beryllium oxide, glass, or other suitable low-cost, rigid material for structural support. An optional interface layer or double-sided tape 232 is formed over carrier 230 as an adhesive bonding film, etch-stop layer, or thermal release layer. Semiconductor wafer 120 is positioned over and mounted to interface layer 232 over carrier 230 with active surface 130 oriented toward the carrier. FIG. 9e shows semiconductor wafer 120 mounted to interface layer 232 over carrier 230.

In FIG. 9e, an insulating or dielectric layer 240 is selectively formed over surface 128 of semiconductor wafer 120 using oxidation or electrografting while leaving insulating layer 222 and conductive micro via 224 exposed. By selectively forming insulating layer 240 to leave insulating layer 222 and conductive micro via 224 exposed, a further step such as CMP, photolithography, or etching is not required to expose conductive micro vias 224. Eliminating the etching or photo step enables the conductive via 138 to have a smaller CD. In one embodiment, the CD of the via is less than 6 μm. In one embodiment, insulating layer 240 is formed over surface 128 of wafer 120 using PVD, CVD, printing, spin coating, or spray coating to form insulating layer 240 while leaving insulating layer 222 and conductive micro via 224 exposed. Insulating layer 240 contains one or more layers of SiO2, Si3N4, SiON, Ta2O5, Al2O3, HfO2, PI, BCB, PBO, polymer, or other material having similar dielectric properties.

Figure 9F:
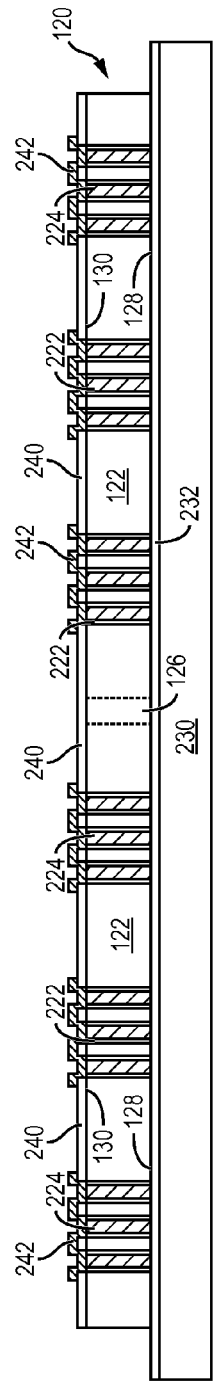

In FIG. 9f, an electrically conductive layer 242 is formed over insulating layer 222 and conductive micro via 224 and selectively applied insulating layer 240 using a patterning and metal deposition process such as sputtering, electrolytic plating, and electroless plating. Conductive layer 242 can be one or more layers of Al, Cu, Sn, Ni, Au, Ag, or other suitable electrically conductive material. Conductive layer 242 operates as an under bump metallization (UBM) layer electrically connected to conductive micro via 224. In one embodiment, UBM layer 242 includes an adhesion layer, seed layer, and wetting and barrier layer. The adhesion layer can be titanium (Ti), titanium nitride (TiN), titanium tungsten (TiW), Al, or chromium (Cr). The seed layer is formed over the adhesion layer and can be Cu, Ni, NiV, Au, or Al. The wetting and barrier layer is formed over the seed layer and can be Ni, NiV, platinum (Pt), palladium (Pd), TiW, or chromium copper (CrCu). The barrier layer inhibits the diffusion of Cu into the die. UBM layer 242 aids with adhesion to conductive micro via 224.

Figure 9G:
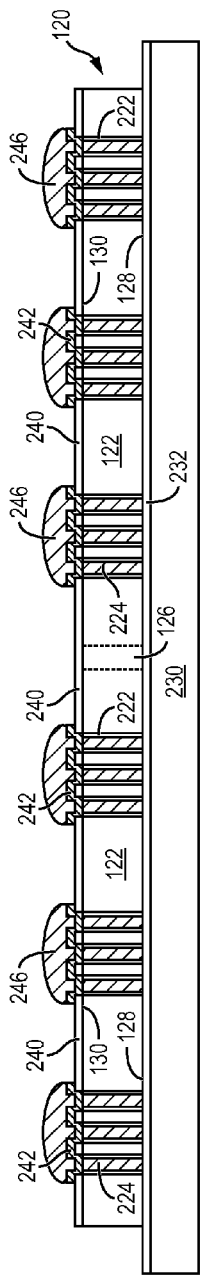

In FIG. 9g, an electrically conductive bump material is deposited over UBM 242 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive UBM 242 using a suitable attachment or bonding process. In one embodiment, the bump material is reflowed by heating the material above its melting point to form balls or bumps 248. In some applications, bumps 248 are reflowed a second time to improve electrical contact to UBM 242. Bumps 248 can also be compression bonded to UBM 242. Bumps 248 represent one type of interconnect structure that can be formed over UBM 242. The interconnect structure can also use stud bumps, micro bumps, or other electrical interconnect structures.

Figure 9H:
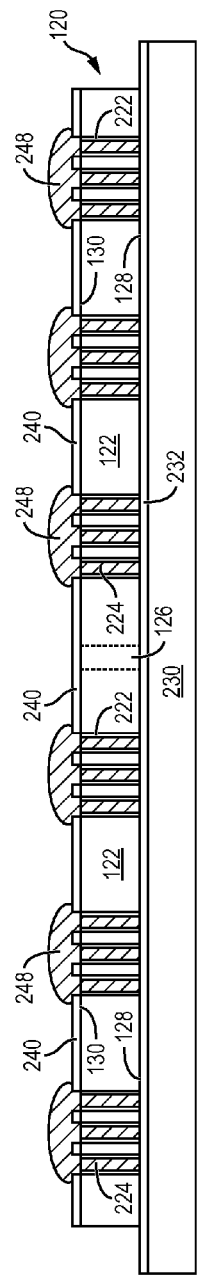

Continuing from FIG. 9e, FIG. 9h shows an electrically conductive bump material deposited into the opening of insulating layer 240 and over exposed conductive micro via 224 and insulating layer 240 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive micro via 224 using a suitable attachment or bonding process. In one embodiment, the bump material is reflowed by heating the material above its melting point to form balls or bumps 248. In some applications, bumps 248 are reflowed a second time to improve electrical contact to conductive micro via 224. Bumps 248 can also be compression bonded to conductive micro via 224. Bumps 248 represent one type of interconnect structure that can be formed over conductive micro via 224. The interconnect structure can also use stud bumps, micro bumps, or other electrical interconnect structures.

Figure 9I:
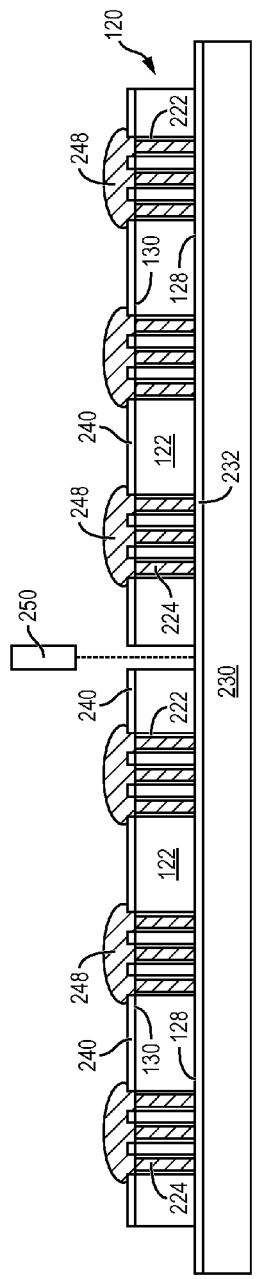

In FIG. 9i, semiconductor wafer 120 is singulated through insulating layer 240 and saw street 126 using a saw blade or laser cutting tool 250 into individual semiconductor die 124. Carrier 230 and interface layer 232 are removed by chemical etching, mechanical peeling, CMP, mechanical grinding, thermal bake, UV light, laser scanning, or wet stripping to expose bumps 148.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor die;
    forming a plurality of openings into a first surface of the semiconductor die;
    depositing an insulating material over sidewalls of the openings;
    depositing a conductive material into the openings of the semiconductor die to form a plurality of conductive vias in the semiconductor die;
    planarizing a second surface of the semiconductor die to remove a portion of the insulating material and expose a top horizontal surface of the conductive vias;
    applying a first insulating layer selectively onto the second surface of the semiconductor die across an entire width of the semiconductor die except for the top horizontal surfaces of the conductive vias, wherein the second surface of the semiconductor die remains coplanar with the top horizontal surface of the conductive vias while applying the first insulating layer; and
    forming a first solder bump on the top horizontal surface of one of the conductive vias and extending into an opening of the first insulating layer, wherein forming the first solder bump is after depositing the conductive material to form the plurality of conductive vias and planarizing the second surface of the semiconductor die.

2. The method of claim 1, further including forming the first insulating layer using oxidation of the semiconductor die.

3. The method of claim 1, further including forming an under bump metallization over the first insulating layer and into the opening of the first insulating layer to contact the top horizontal surface of the conductive vias.

4. The method of claim 1, further including forming the first solder bump over a plurality of the conductive vias and extending into a plurality of openings of the insulating layer.

5. A method of making a semiconductor device, comprising:
    providing a semiconductor die;
    forming a plurality of conductive vias in the semiconductor die;
    planarizing the semiconductor die and conductive vias to leave a surface of the semiconductor die that is coplanar with a top horizontal surface of each of the conductive vias;
    applying a first insulating layer laterally over an entire width of the surface of the semiconductor die except for the top horizontal surfaces of the conductive vias after forming the plurality of conductive vias, wherein a length of the conductive vias in a thickness direction is greater than a length of the semiconductor die in a thickness direction; and
    forming an interconnect structure on the top horizontal surfaces of the conductive vias within a height of the first insulating layer after applying the first insulating layer.

6. The method of claim 5, further including forming the first insulating layer using electrografting.

7. The method of claim 5, further including forming an under bump metallization over the conductive via.

8. The method of claim 5, further including removing a portion of the semiconductor die to expose the conductive via.

9. The method of claim 5, further including forming the interconnect structure over a plurality of conductive vias.

10. The method of claim 5, further including forming the conductive via with a height greater than a height of the semiconductor die.

11. The method of claim 5, further including:
    forming a second insulating layer over the first insulating layer; and
    removing a portion of the second insulating layer to expose the top horizontal surface of the conductive via.

12. A method of making a semiconductor device, comprising:
    providing a semiconductor die;
    forming a conductive via in the semiconductor die including a top horizontal surface of the conductive via coplanar with the semiconductor die; and
    applying a first insulating layer selectively over an entire width of the semiconductor die while the conductive via remains coplanar with the semiconductor die, wherein the first insulating layer includes an opening in the first insulating layer over the top horizontal surface of the conductive via.

13. The method of claim 12, further including forming the first insulating layer using electrografting or oxidation.

14. The method of claim 12, further including removing a portion of the semiconductor die to expose the top horizontal surface of the conductive via.

15. The method of claim 12, further including forming an interconnect structure over a plurality of conductive vias.

16. The method of claim 12, further including:
    forming a second insulating layer over the first insulating layer; and
    removing a portion of the second insulating layer to expose the conductive via.

17. A method of making a semiconductor device, comprising:
    providing a substrate;
    forming a conductive via in the substrate;
    removing a portion of the substrate to expose a top horizontal surface of the conductive via; and
    forming a first insulating layer selectively across an entire width of the substrate to include an opening in the first insulating layer over the top horizontal surface of the conductive via.

18. The method of claim 17, further including forming the first insulating layer using electrografting or oxidation.

19. The method of claim 17, further including forming an under bump metallization over the conductive via.

20. The method of claim 17, further including forming an interconnect structure over a plurality of conductive vias.

21. The method of claim 17, further including:
    forming a second insulating layer over the first insulating layer; and removing a portion of the second insulating layer to expose the conductive via.

22. The method of claim 1, further including:

forming a plurality of second solder bumps on the conductive vias;

disposing the semiconductor die on a carrier with the second solder bumps extending from the conductive vias to the carrier;

depositing an underfill material between the semiconductor die and carrier around the second solder bumps; and planarizing the second surface of the semiconductor die while the semiconductor die remains on the carrier.

23. The method of claim 22, further including singulating the semiconductor die from a semiconductor wafer after forming the first solder bump while the semiconductor die remains on the carrier.

24. The method of claim 1, further including:

depositing a second insulating layer over the first insulating layer opposite the semiconductor die and in direct physical contact with the top horizontal surface of the conductive via;

removing a portion of the second insulating layer to form an opening through the second insulating layer and expose the top horizontal surface of the conductive via; and forming the first solder bump extending into the opening of the first insulating layer and the opening of the second insulating layer.

25. The method of claim 1, further including forming the first insulating layer extending continuously across the entire width of the semiconductor die.

* * * * *